United States Patent
Siddiqui

(10) Patent No.: US 10,596,945 B2
(45) Date of Patent: Mar. 24, 2020

(54) MECHANISM FOR HOLDING AT LEAST ONE ARTICLE

(71) Applicant: FAURECIA INTERIOR SYSTEMS INDIA PRIVATE LIMITED, Bhosari, Pune, MH (IN)

(72) Inventor: Firoz Siddiqui, Pune (IN)

(73) Assignee: FAURECIA INTERIOR SYSTEMS INDIA PRIVATE LIMITED, Bhosari, Pune, MH (IN)

(*) Notice: Subject to any disclaimer, the term of this patent is extended or adjusted under 35 U.S.C. 154(b) by 0 days.

(21) Appl. No.: 15/994,457

(22) Filed: May 31, 2018

(65) Prior Publication Data

US 2018/0345842 A1  Dec. 6, 2018

(30) Foreign Application Priority Data

May 31, 2017 (IN) .............................. 201721019201

(51) Int. Cl.
*B60N 3/10* (2006.01)
*H03K 17/955* (2006.01)

(52) U.S. Cl.
CPC .............. *B60N 3/102* (2013.01); *B60N 3/106* (2013.01); *H03K 17/955* (2013.01)

(58) Field of Classification Search
CPC .......... B60N 3/102; B60N 3/106; B60N 3/10; B60N 3/101; B60N 3/105–108; H03K 17/955; A47G 23/02; A47G 23/0208; A47G 23/0216
USPC ....................................................... 248/311.2
See application file for complete search history.

(56) References Cited

U.S. PATENT DOCUMENTS

| | | | |
|---|---|---|---|
| 5,154,380 A * | 10/1992 | Risca ................. | A47G 23/0216 248/154 |
| 5,398,898 A * | 3/1995 | Bever ................ | A47G 23/0225 248/154 |
| 6,092,775 A * | 7/2000 | Gallant ................. | B60N 3/106 224/926 |
| 6,695,271 B2 * | 2/2004 | Bieck ..................... | B60N 3/102 224/926 |
| 6,758,452 B1 * | 7/2004 | Salenbauch .............. | B60N 3/10 224/926 |
| 6,843,397 B2 * | 1/2005 | Then .................... | B60N 2/0224 224/552 |
| 7,874,535 B2 * | 1/2011 | Ogura .................... | B60N 3/106 224/281 |

(Continued)

*Primary Examiner* — Nkeisha Smith
(74) *Attorney, Agent, or Firm* — Reising Ethington P.C.

(57) ABSTRACT

A mechanism for holding an article. The mechanism includes a rotatable member, at least two holding members and a sensor. The rotatable member is rotatably mounted below a base and controlled by a motor to rotate around a vertical rotation axis. The holding members are each mechanically linked by a connecting member to the rotatable member. The rotation of the rotatable member in a first direction moves the holding member from a rest position to a holding position and rotation of the rotatable member in a second direction moves the holding member to the rest position. The sensor is arranged on the base and adapted to sense the article in proximity. The sensor upon sensing the article rotates the rotatable member in the first direction to move the holding members to the holding position and rotates the rotatable member in the second direction upon removal the article from the base.

19 Claims, 5 Drawing Sheets

(56) References Cited

U.S. PATENT DOCUMENTS

| | | | |
|---|---|---|---|
| 9,637,078 B2 * | 5/2017 | Bull | B60R 21/0132 |
| 9,643,525 B2 * | 5/2017 | Dargavell | B60N 3/106 |
| 9,919,634 B2 * | 3/2018 | Flothmann | B60N 3/101 |
| 2006/0175506 A1 * | 8/2006 | Lan | A47G 23/0216 |
| | | | 248/311.2 |
| 2006/0243875 A1 * | 11/2006 | Chen | B60N 3/106 |
| | | | 248/311.2 |
| 2014/0124638 A1 * | 5/2014 | Takai | B60N 3/106 |
| | | | 248/311.2 |
| 2014/0299612 A1 * | 10/2014 | Brinas | B60N 3/106 |
| | | | 220/600 |

* cited by examiner

MECHANISM FOR HOLDING AT LEAST ONE ARTICLE

TECHNICAL FIELD

The present invention relates to a cup holder for a vehicle. More particularly, the present invention relates to a mechanism for holding at least one article in the cup holder.

BACKGROUND

Cup holders are commonly used mechanisms to hold a cup of water, tea, coffee or any other articles in vehicles especially in four wheeled vehicles. Cup holders can be a simple cavity provided on an arm rest or a middle console to hold the cups. Cup holders can also be used to hold other articles than cups or beverage cans. These cup holders are typically not secured as there are no securing means to hold the cups. Further, cup holders that do have holding members operate on pressure actuated sensor mechanisms and latch mechanisms. These mechanisms helps the holding member to securely hold the cup therein. But these mechanisms are complex underneath and require more space for operation. Further, spilling of food particles or dust etc. in sink holes formed during the operation of the mechanism may trouble the operation of the cup holder.

Therefore, there is a need of a mechanism to securely hold the articles overcoming the draw backs of the prior art.

SUMMARY

An object of the present invention is to provide a mechanism for holding an article inside a vehicle; specifically for holding articles in a cup holder.

Another object of the present invention is to provide a mechanism for holding an article, which holds the article automatically using an electronic sensor and a motor.

Yet another object of the present invention is to provide a mechanism for holding an article, which is aesthetically pleasing.

One more object of the present invention is to provide a mechanism for holding an article, which is simple in construction and does not take much space for the underneath mechanism.

Still one more object of the present invention is to provide a mechanism for holding an article, which is easy to operate and economical in construction.

According to an aspect of the present invention, a mechanism for holding an article is provided. The mechanism comprises a rotatable member, at least two holding members and a sensor. The rotatable member is rotatably configured below a base for rotating around a vertical rotation axis. The at least two holding members are mechanically linked by a connecting member to the rotatable member.

Further, a motor is provided to produce rotational motion to the rotatable member. The motor may be connected to the rotatable member using for example a rod, a worm wheel or a belt. The rotation of the rotatable member in the first direction moves the holding member from a rest position to a holding position. Rotation of the rotatable member in a second direction moves the holding member to the rest position. By way of non-limiting example, clockwise rotation of the rotatable member moves the holding member from a rest position to a holding position. In the holding position, the extension of the holding member in a vertical upward direction is larger than the extension of the holding member in the vertical direction when it is in the rest position. In the holding position the holding members are in a position to hold an article in between. A first end of each connecting member is slidably arranged to the rotatable member for sliding the first end of the connecting member away from or to the vertical rotation axis upon rotation of the rotatable member. A second end of each connecting member is connected with a corresponding holding member such that the connecting member provides a lever for pivoting the holding member by rotation of the rotatable member.

Further, the sensor is arranged in the base and adapted to sense the article in proximity. The sensor may be a proximity sensor which detects whether an article is in proximity of the base in between the holding members. In particular, the proximity sensor may detect when an article is placed on the base in between the holding members. The sensor may for example be an infrared sensor, a capacitive sensor or a pressure sensor. The sensor upon sensing the article rotates the rotatable member in the first direction to configure the holding position and rotates the rotatable member in the second direction upon removing the article from the base. Also, in the present embodiment, a compressible portion is provided on top of the holding member to accommodate articles of various sizes.

BRIEF DESCRIPTION OF DRAWINGS

The advantages and features of the present invention will be understood better with reference to the following detailed description of some embodiments and claims taken in conjunction with the accompanying drawings, wherein like elements are identified with like symbols, and in which:

DETAILED DESCRIPTION

An embodiment of this invention, illustrating its features, will now be described in detail. The words "comprising," "having," "containing," and "including," and other forms thereof, are intended to be equivalent in meaning and be open ended in that an item or items following any one of these words is not meant to be an exhaustive listing of such item or items, or meant to be limited to only the listed item or items.

The terms "first," "second," and the like, herein do not denote any order, quantity, or importance, but rather are used to distinguish one element from another, and the terms "a" and "an" herein do not denote a limitation of quantity, but rather denote the presence of at least one of the referenced item.

The present invention may be used to provide a mechanism for holding an article inside a vehicle, and specifically for holding articles in a cup holder. The mechanism is not limited to holding cups, but may also hold beverage cans and other tangible products. The mechanism is to hold an article automatically using a proximity sensor and a motor. The mechanism is aesthetically pleasing. Further, the mechanism is simple in construction and does not take much space for the underneath mechanism. Also, the mechanism is easy to operate and economical in construction.

The disclosed embodiments are merely exemplary of the invention, which may be embodied in various forms.

Figure 1:
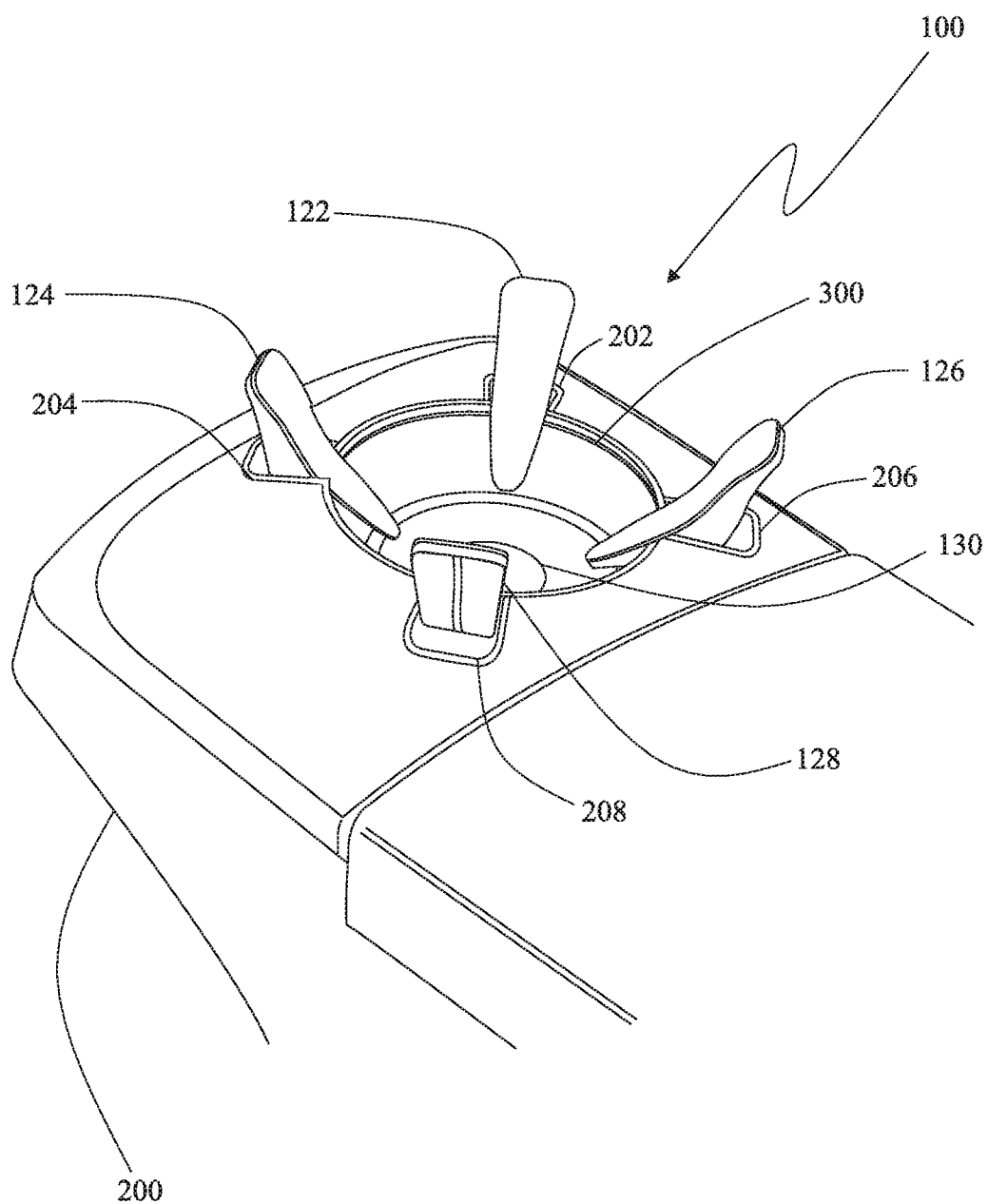
FIG. 1 shows an embodiment of a mechanism for holding an article inside a vehicle in accordance with an embodiment of the present invention.
Figure 2:
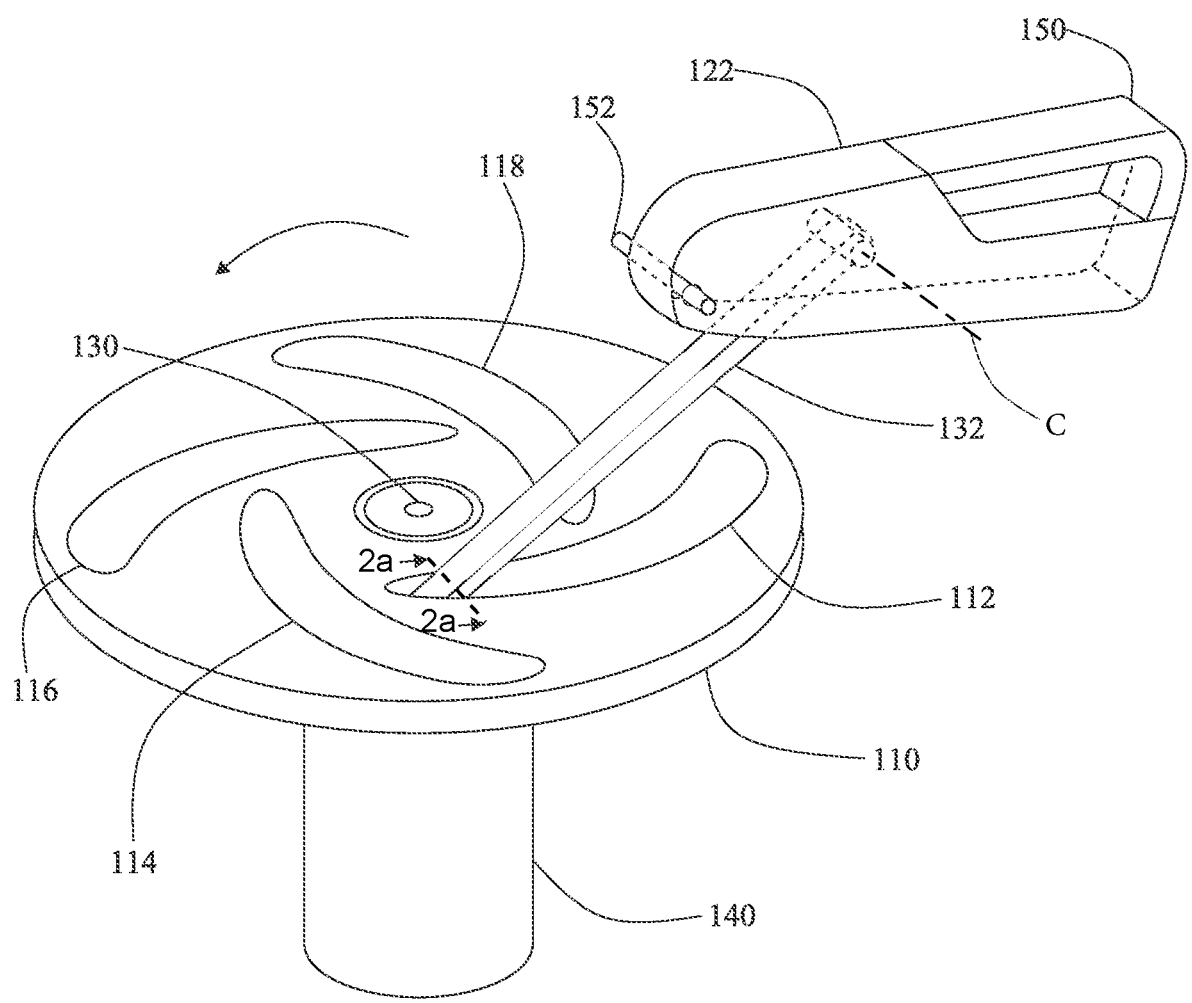
FIG. 2 shows a partly assembled view of an embodiment of the mechanism.

Referring to FIG. 1 and FIG. 2, embodiments of a mechanism 100 for holding an article is illustrated. The mechanism 100 is specifically for holding articles inside a vehicle such as a cup or a beverage can and the like. The mechanism 100 comprises a rotatable member 110, at least two holding members, a sensor 130 and a motor 140. The present embodiments of the invention are provided with four holding members like the first holding member 122, the second holding member 124, a third holding member 126 and a fourth holding member 128. However, also in particular three holding members may be preferred. The mechanism 100 is provided on a middle console, more in particular on or in the vicinity of an arm rest 200 of the vehicle. The mechanism 100 may be provided in other alternative configurations such as in an instrument console or in a retractable table and the like.

In FIG. 1, a top portion of the arm rest 200 is configured with a base 300 for the mechanism 100. The base 300 may be the bottom of a recess of the arm rest 200 in the area between the holding members 122, 124, 126 and 128 in order to allow a more stable positioning of the cup. The arm rest 200 may have additional recesses 202, 204, 206 and 208 for receiving the holding members 122, 124, 126 and 128 in their rest position. In FIG. 2, the rotatable member 110 is being configured below the base 300 for rotating around a vertical rotation axis. The rotatable member 110 is a rotatable disc connected to a motor 140. The motor 140 rotates the rotatable member 110 in the first direction and in the second direction. The rotatable member 110 can rotate according to the rotation of the motor 140. The motor 140 being configured to rotate the rotatable member 110 and is arranged below the rotatable member 110 and connected via a rod 142 with the rotatable member 110 as shown in FIGS. 3, 4, 5 and 6. However, alternatives to such a direct connection between the motor 140 and the rotatable member 110 are possible. The motor 140 may for example be connected via a worm gear or a belt for rotating the rotatable member 110. The motor 140 preferably is an electrical motor. The rotation of the motor 140 is controlled by the sensor 130. The sensor 130 is an electronic sensor, specifically a proximity sensor. The proximity sensor may for example be a capacitive sensor, a pressure sensor, or an infrared sensor. The sensor 130 is preferably arranged centrally in the base 300 in between the holding members 122, 124, 126 and 128 and above the rotatable member 110. The sensor 130 is adapted to sense the article in proximity.

Figure 2A:
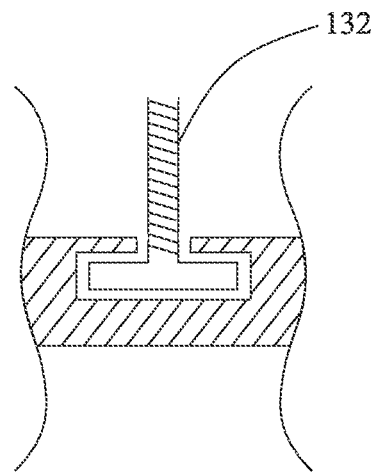
FIG. 2a shows a cross sectional view of arrangement of a connecting member in the mechanism as shown in FIG. 2.
Figure 3:
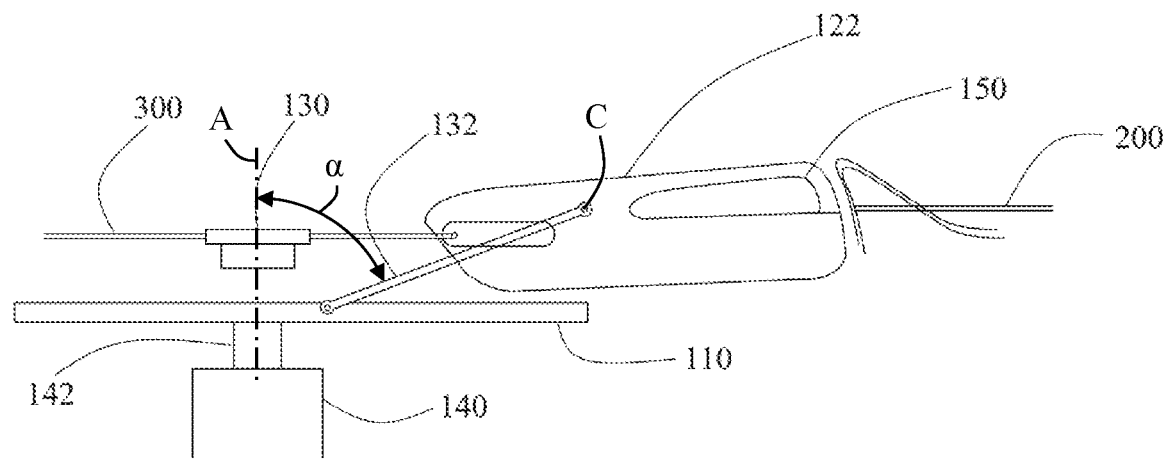
FIG. 3 shows a rest position of the mechanism of FIG. 2, including an angle (α) between a vertical rotation axis (A) and a connecting member and a common axis (C) about which both the connecting member and a corresponding holding member pivot during movement toward the holding position of FIG. 6.
Figure 4:
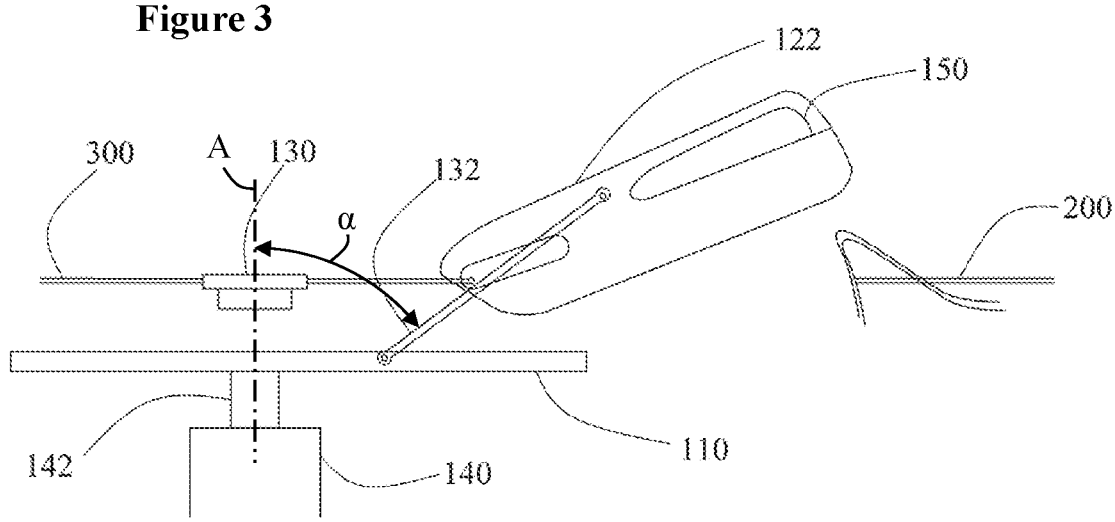
FIG. 4 and FIG. 5 show various positions of the mechanism of FIG. 2 during movement from the rest position of FIG. 3 to the holding position of FIG. 6, during which the angle (α) decreases.

Further, each of the first holding member 122, the second holding member 124, the third holding member 126 and the fourth holding member 128 is mechanically linked and pivotally connected by a connecting member to the rotatable member 110. In the present embodiment, four connecting members are provided to connect each of the holding members 122, 124, 126 and 128 to the rotatable member 110. In the FIGS. 2, 3, 4, 5 and 6 only one connecting member 132 is shown. The other connecting members may be similar to connecting member 132. The connecting member 132 is an elongated rod connecting each of the holding members 122, 124, 126 and 128 with the rotatable member 110. Specifically, a first end of the connecting member 132 is slidably arranged to the rotatable member 110 for sliding the first end of the connecting member 132 away from or to the vertical rotation axis upon rotation of the rotatable member 110 as shown in FIG. 2a. A second end of the connecting member 132 is connected with the respective holding members 122, 124, 126 and 128, such that the connecting member 132 provides a lever for pivoting the respective holding members 122, 124, 126 and 128 by rotation of the rotatable member 110.

Figure 5:
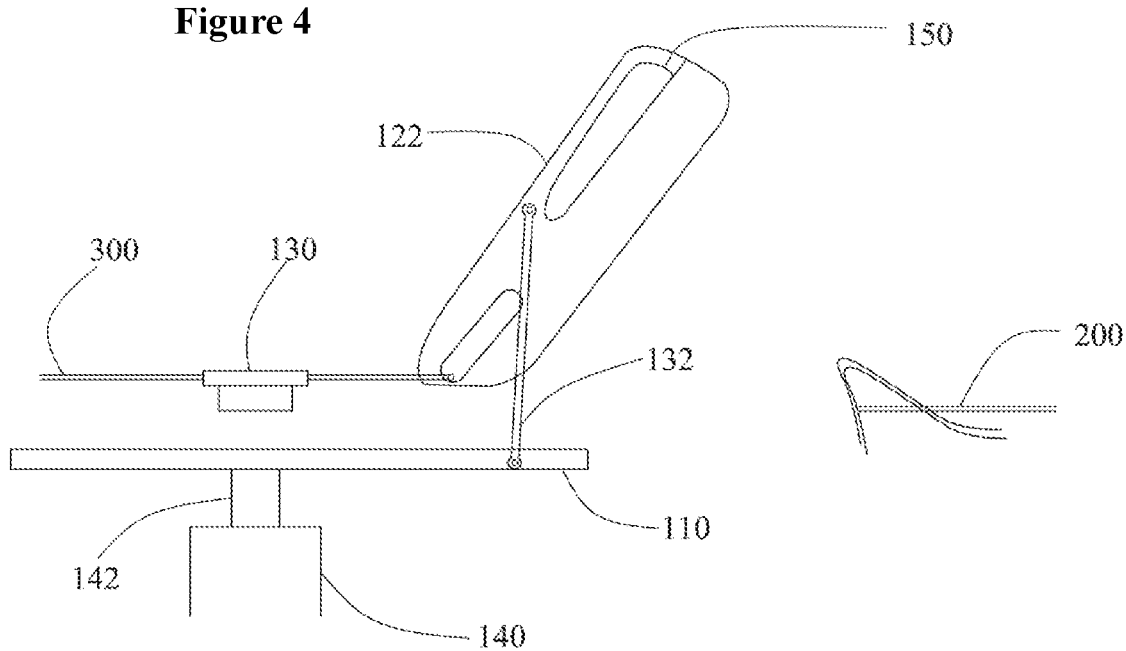
Figure 6:
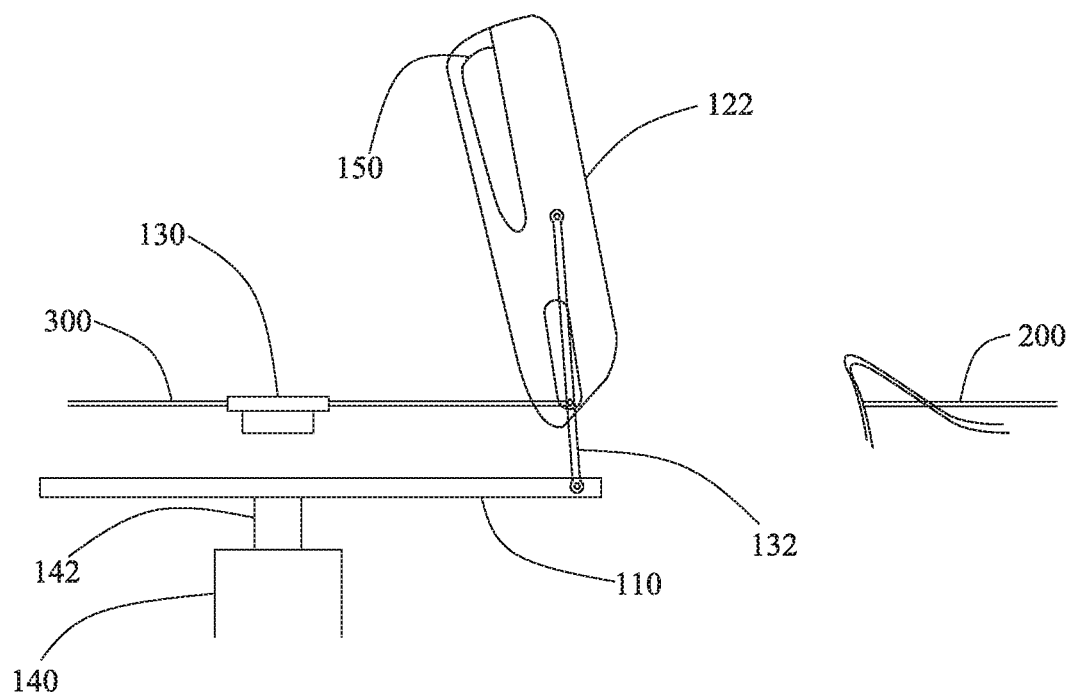
FIG. 6 shows a holding position of the mechanism of FIG. 2.

The rotatable member 110 is provided with arcuate cavities to slide the connecting member 132 inside the rotatable member 110 from a position close to the rotation axis of the rotatable member 110 to a position close to the rim of the rotatable member 110. In the present embodiment, four arcuate cavities are provided like 112, 114, 116 and 118. Each first end of the connecting member 132 slides and moves along or in one of the arcuate cavities 112, 114, 116 and 118. By way of non-limiting example, the first end of connecting member 132 slides and moves along the arcuate cavity 112 upon rotation of the rotatable member 110. In an alternate embodiment, each of the holding members 122, 124, 126 and 128 and the rotatable member 110 are integral to each other. Upon rotation of the rotatable member 110, the first ends of the connecting members 132 can move from a position close the rotation axis of the rotatable member 110 to a position close to the rim of the rotatable member 110. In the FIGS. 2 and 3, the first end of connecting member 132 is in a position close to the rotation axis of the rotatable member 110. In FIG. 5, the first end of the connecting member 132 is close to the rim of the rotatable member 110. Starting from the position indicated in FIG. 5 and rotating the rotatable member 110 in an opposite direction, the first end of the connecting member 132 will move towards the rotation axis of the rotatable member 110.

In a preferred embodiment, the second end of each of the connecting members is connected with the corresponding holding members 122, 124, 126 and 128 such that the respective connecting members provides a lever for pivoting the holding members 122, 124, 126 and 128 by rotation of the rotatable member 110 around an axis that has a fixed position relative to the base 300. This lever function is illustrated for the connecting member 132 in the FIGS. 3, 4, 5, and 6.

Figure 8:
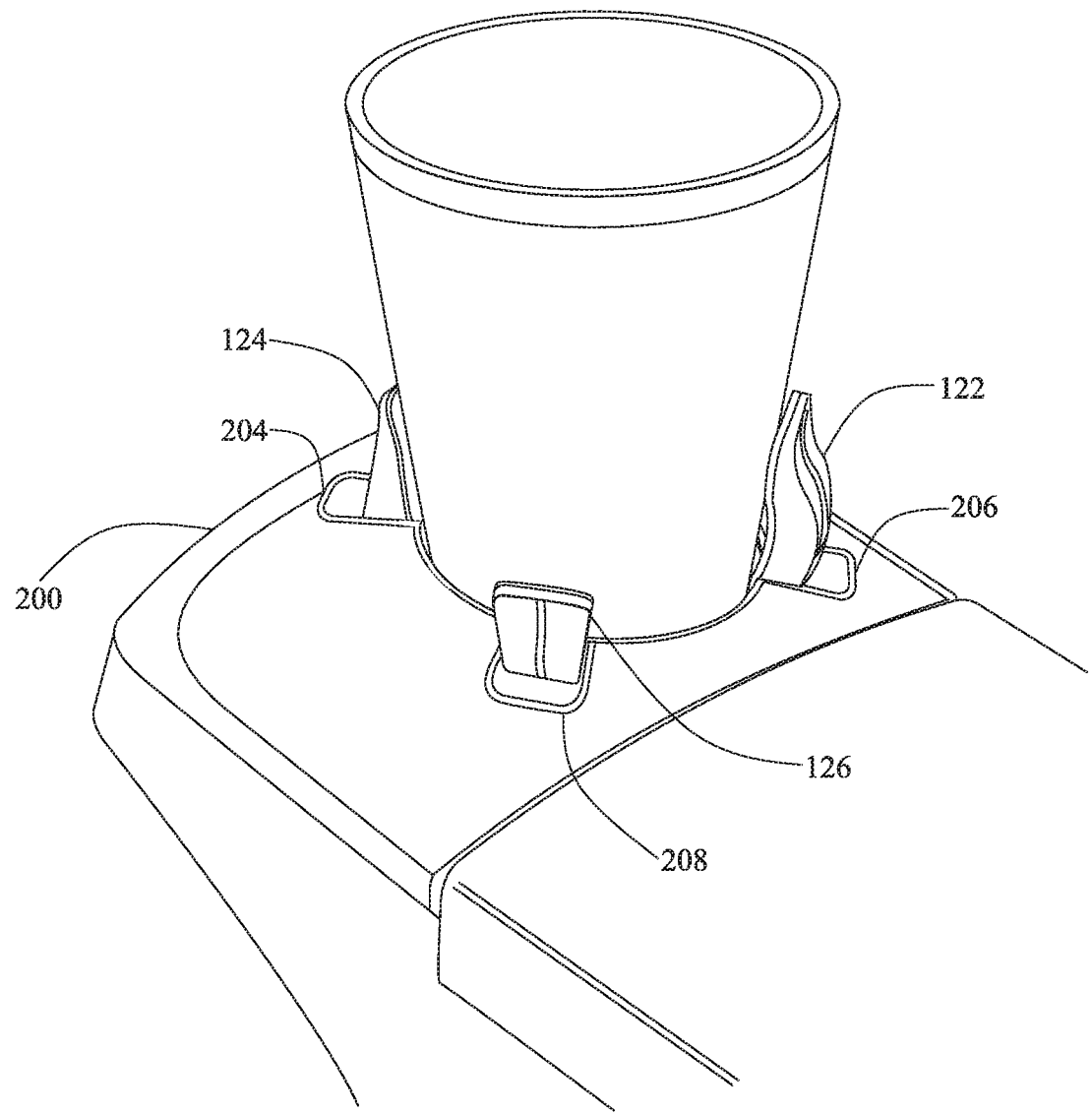
FIG. 8 shows a perspective view of the mechanism of FIG. 1 in a holding position.

Further referring to FIGS. 1 and 2, the holding members 122, 124, 126 and 128 are provided to securely hold the articles therein. Each of the holding members 122, 124, 126 and 128 are pivotally connected to a portion of the base 300 for pivoting around a horizontal axis 152. Each of the holding members 122, 124, 126 and 128 moves from a rest position to a holding position to securely hold an article as shown in FIGS. 3, 4, 5 and 6 respectively. In the rest position of FIG. 3, each of the holding members 122, 124, 126 and 128 lays horizontal to the base 300. Preferably, the holding members 122, 124, 126 and 128 are received by recesses 202, 204, 206 and 208 in the armrest 200. By way of non-limiting example, each of the holding members 122, 124, 126 and 128 is a petal like arrangement which pivots vertically upwards to configure the holding position. In the rest position, the connecting member 132 is in a slanting position. The same holds for the connecting members (not shown) of the other holding members 124, 126 and 128. In the holding position, the connecting member 132 slides along the arcuate cavity 112 of the rotatable member 110 and comes in a vertical position and configures the holding member 122 in the holding position. Again, the same holds for the connecting members which slide along the arcuate cavities 114, 116 and 118. The holding members 122, 124, 126 and 128 form a cavity along with the base 300 to securely hold an article therein in the holding position as shown in the example of FIG. 8.

The sensor 130 provides a signal to a controller (not shown in Figures) configured below the base 300 or somewhere else in the vehicle to regulate the rotational movement of the motor 140 and thereby controlling the rotation of the rotatable member 110. The rotation of the rotatable member 110 in a first direction moves each of the holding members 122, 124, 126 and 128 to configure the holding position. In the holding position, the holding members 122, 124, 126 and 128 are configured vertically upwards forming a cavity in the base 300 to hold the articles therein. The rotation of the rotatable member 110 in a second direction moves the holding members 122, 124, 126 and 128 to a rest position.

Specifically, the sensor 130 upon sensing the article in a proximity as predefined, provides signal to the controller to operate the motor 140. By way of non-limiting example, the motor 140 rotates in a clockwise direction to move the each of the holding members 122, 124, 126 and 128 to the holding position to hold the articles therein. Similarly, the motor 140 rotates in a counterclockwise direction to move each of the holding members 122, 124, 126 and 128 towards the base 300, back to the rest position when the article is moved away from the proximity of the sensor 130.

The holding members 122, 124, 126 and 128 will move to the rest position if the article is removed. The sensor 130 may for example detect that the pressure is reduced or that the distance between the sensor 130 and the article is increased above a predetermined value because a person is lifting the article. In a specific embodiment, the mechanism 100 may comprise a switch to instruct the motor 140 to move the holding members 122, 124, 126 and 128 to the rest position.

Figure 7:
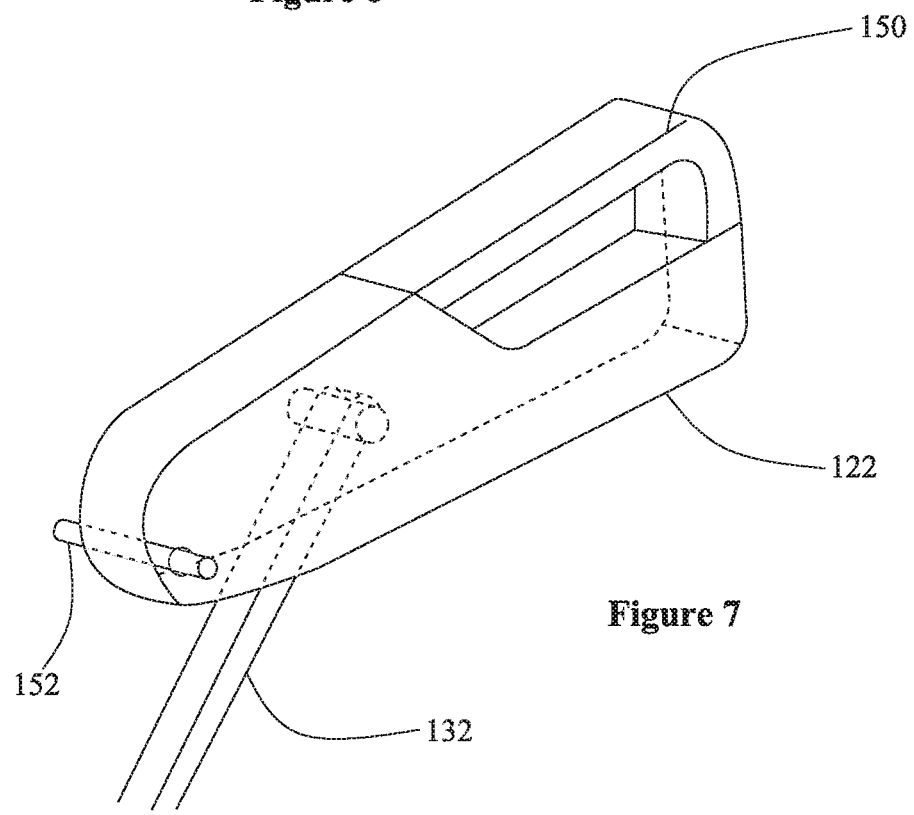
FIG. 7 shows a holding member of the mechanism of FIG. 2.

Further, each of the holding members 122, 124, 126 and 128 may have compressible portions on top. By way of non-limiting example, the holding member 122 may have a compressible portion 150 as shown in FIG. 7. The compressible portion 150 compresses and relaxes to accommodate the articles of various sizes. Specifically, when the article of larger sizes is kept in the holding position, the compressible portion 150 gets compressed to accommodate the article. In the rest position, the compressible portion 150 moves to normal position. In the present embodiment, each of the holding members 122, 124, 126 and 128 is made of metal. It may be obvious to a person skilled in the art to provide the holding members 122, 124, 126 and 128 to be made of plastic, wood or the like.

Therefore, the mechanism 100 in the present invention has an advantage of holding articles inside a vehicle specifically for holding cups or beverage cans. The mechanism 100 may hold the articles automatically using a motor and one or more sensors for detecting the presence of an article. The mechanism 100 is aesthetically pleasing. Further, the mechanism 100 is simple in construction and does not take much space for the underneath mechanism 100. Also, the mechanism 100 is easy to operate and economical in construction.

The foregoing description of specific embodiments of the present invention have been presented for purposes of illustration and description. They are not intended to be exhaustive or to limit the present invention to the precise forms disclosed, and obviously many modifications and variations are possible in light of the above teaching. The embodiments were chosen and described in order to best explain the principles of the present invention and its practical application, to thereby enable others skilled in the art to best utilize the present invention and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present invention.

The invention claimed is:

1. A mechanism for holding at least one article, the mechanism comprising:
   a rotatable member being positioned below a base and configured to rotate around a vertical rotation axis;
   at least two holding members that are each mechanically linked by a connecting member to the rotatable member, wherein rotation of the rotatable member in a first direction moves the holding members from a rest position to a holding position, and wherein rotation of the rotatable member in a second direction moves the holding members to the rest position; and
   a sensor arranged in the base and adapted to sense the article in proximity, wherein the sensor upon sensing the article causes the rotatable member to rotate in the first direction to the holding position and upon sensing removal of the article from the base causes the rotatable member to rotate in the second direction,
   wherein the base overlies the rotatable member so that the at least one article contacts the base but does not contact the rotatable member during use.

2. The mechanism as claimed in claim 1, wherein the rotatable member is connected to a motor, the motor being configured to rotate the rotatable member in the first direction and in the second direction.

3. The mechanism as claimed in claim 1, wherein a first end of the connecting member is slidably connected to the rotatable member so as to slide the first end of the connecting member away from or towards the vertical rotation axis upon rotation of the rotatable member.

4. The mechanism as claimed in claim 1, wherein each of holding members is pivotable into a portion of the base.

5. The mechanism as claimed in claim 1, wherein, for each of the holding members, a second end of the connecting member is connected with the holding member, such that the connecting member provides a lever for pivoting the holding member by rotation of the rotatable member.

6. The mechanism as claimed in claim 1, wherein each of the holding members has a compressible portion at a top portion of the holding member, the compressible portion to accommodate articles of various sizes.

7. The mechanism as claimed in claim 1, wherein the sensor is a proximity sensor.

8. The mechanism as claimed in claim 1, wherein the sensor provides signal to a controller configured below the base to regulate the rotational movement of the rotatable member.

9. The mechanism as claimed in claim 1, wherein the rotatable member and each of the holding members are integral to each other.

10. The mechanism as claimed in claim 1, wherein each of the holding members are made of wood or plastic or metal.

11. The mechanism as claimed in claim 1, wherein each connecting member has an orientation that changes during movement of the holding members from the rest position to the holding position.

12. The mechanism as claimed in claim 1, wherein the holding members pivot about a horizontal axis during movement from the rest position to the holding position.

13. The mechanism as claimed in claim 1, wherein an angle between each connecting member and the vertical rotation axis decreases during movement from the rest position to the holding position.

14. The mechanism as claimed in claim 1, wherein each connecting member is pivotably connected to one of the holding members so that each connecting member and corresponding holding member pivot about a common axis during movement from the rest position to the holding position.

15. A mechanism for holding at least one article, the mechanism comprising:
- a rotatable member being positioned below a base and configured to rotate around a vertical rotation axis;
- at least two holding members that are each mechanically linked by a connecting member to the rotatable member, wherein rotation of the rotatable member in a first direction moves the holding members from a rest position to a holding position, and wherein rotation of the rotatable member in a second direction moves the holding members to the rest position,
- wherein each connecting member has an orientation that changes during movement of the holding members from the rest position to the holding position, and
- wherein the holding members pivot about a horizontal axis during movement from the rest position to the holding position.

16. The mechanism as claimed in claim 15, further comprising a sensor arranged in the base and adapted to sense the article in proximity, wherein the sensor upon sensing the article causes the rotatable member to rotate in the first direction to the holding position and upon sensing removal of the article from the base causes the rotatable member to rotate in the second direction.

17. The mechanism as claimed in claim 15, wherein an angle between each connecting member and the vertical rotation axis decreases during movement from the rest position to the holding position.

18. A mechanism for holding at least one article, the mechanism comprising:
- a rotatable member being positioned below a base and configured to rotate around a vertical rotation axis;
- at least two holding members that are each mechanically linked by a connecting member to the rotatable member, wherein rotation of the rotatable member in a first direction moves the holding members from a rest position to a holding position, and wherein rotation of the rotatable member in a second direction moves the holding members to the rest position,
- wherein each connecting member has an orientation that changes during movement of the holding members from the rest position to the holding position, and
- wherein each connecting member is pivotably connected to one of the holding members so that each connecting member and corresponding holding member pivot about a common axis during movement from the rest position to the holding position.

19. The mechanism as claimed in claim 18, further comprising a sensor arranged in the base and adapted to sense the article in proximity, wherein the sensor upon sensing the article causes the rotatable member to rotate in the first direction to the holding position and upon sensing removal of the article from the base causes the rotatable member to rotate in the second direction.

* * * * *